United States Patent [19]
Peloza

[11] Patent Number: 5,244,414
[45] Date of Patent: Sep. 14, 1993

[54] BOARDLOCK SYSTEM FOR ELECTRICAL CONNECTORS

[75] Inventor: Kirk B. Peloza, Naperville, Ill.

[73] Assignee: Molex Incorporated, Lisle, Ill.

[21] Appl. No.: 993,572

[22] Filed: Dec. 21, 1992

[51] Int. Cl.$^5$ .......................................... H01R 13/73
[52] U.S. Cl. ................................................. 435/567
[58] Field of Search ............... 435/557, 567, 554, 571, 435/84, 553

[56] References Cited

U.S. PATENT DOCUMENTS

| | | | |
|---|---|---|---|
| 2,863,131 | 12/1958 | Carlzen et al. | 439/554 X |
| 4,616,893 | 10/1986 | Feldman | 339/14 |
| 5,074,807 | 12/1991 | Parmer | 439/553 |
| 5,080,611 | 1/1992 | Hypes | 439/567 |
| 5,096,440 | 3/1992 | Katsumata | 439/570 |
| 5,184,963 | 2/1993 | Ishikawa | 439/554 X |

*Primary Examiner*—Eugene F. Desmond
*Attorney, Agent, or Firm*—Stephen Z. Weiss

[57] ABSTRACT

A boardlock system is disclosed for an electrical connector assembly mountable on a surface of a printed circuit board. The connector assembly includes a dielectric housing having an upper face with a plurality of terminal-receiving passages for top loading a plurality of terminals thereinto and a lower circuit board engaging face. The boardlock system includes a boardlock-receiving cavity at one side of the housing with an open top at one side of the upper face and an access slot in the side of the housing communicating with the cavity for insertion thereinto of a tool from the side of the housing. A boardlock device is insertable into the open top of the cavity and includes a lower end for interengagement with the circuit board for holding the connector assembly on the board. The boardlock device includes an upper end located in the cavity, aligned with the access slot, for engagement by the tool from the side of the housing.

10 Claims, 1 Drawing Sheet

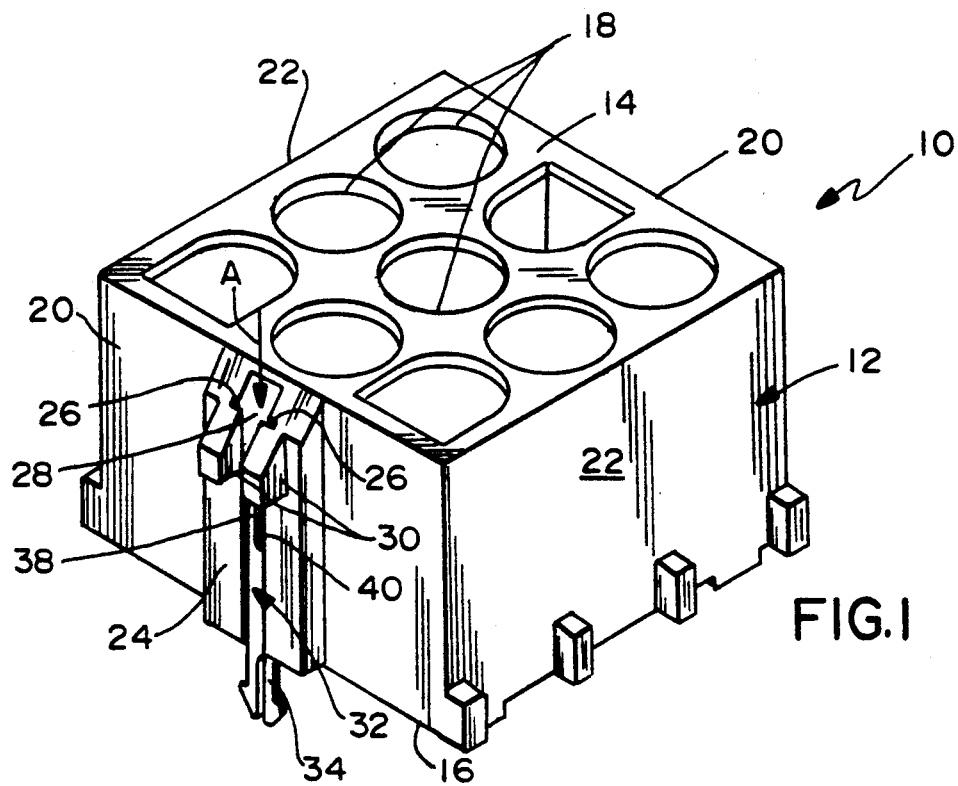
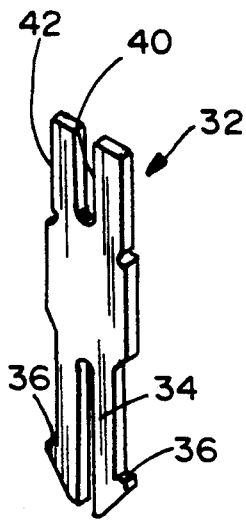
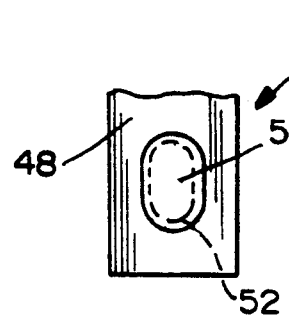
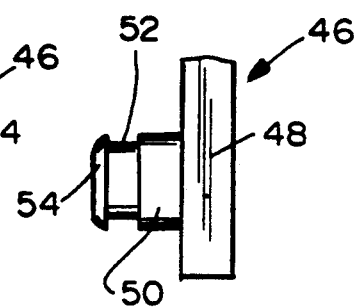
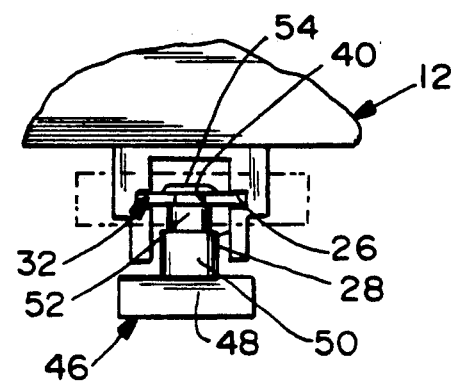

BOARDLOCK SYSTEM FOR ELECTRICAL CONNECTORS

FIELD OF THE INVENTION

This invention generally relates to the art of electrical connectors and, particularly, to a board lock system for mounting an electrical connector assembly on a surface of a printed circuit board.

BACKGROUND OF THE INVENTION

In surface mount systems, individual terminals of a surface mounted electrical connector are interconnected to contact pads or circuit traces on a printed circuit board, normally by reflow soldering tail portions of the terminals to the conductive pads on the surface of the circuit board or in holes in the board. Fastening means are provided for securing a housing of the connector to the circuit board to afford strain relief to prevent inadequate engagement of the terminals with the board, breaking of the solder interfaces between the terminals and the board, and/or inadequate engagement of the terminals with mating terminals of another complementary connector mated to the surface mount connector. Such means often are called "boardlocks" projecting from a lower circuit board engaging face of the housing into holes in the circuit board. Boardlocks may be provided in a variety of schemes, ranging from mounting pegs molded integrally with the connector housing to separate boardlock devices, usually of metal, mounted on the housing.

The continuing trend toward high density circuitry has resulted in increasing miniaturization and complexity of integrated circuit components, including surface mount connectors of the character described above. The connectors, themselves, have become extremely miniaturized so that cost and board real estate are effectively optimized.

When the electrical connector housing is used for mounting a plurality of terminals, usually within through passages in the housing, as well as mounting one or more boardlock devices, the housing often is unnecessarily large to accommodate mounting of the boardlock devices. For instance, if the housing has a particular rectangular configuration for mounting a plurality of terminals in passages therethrough, the housing must be enlarged to also accommodate mounting of the boardlock devices. The enlarged housing consumes valuable board real estate.

In addition, it often is desirable to top load the terminals into a plurality of terminal-receiving passages in an upper face of the housing in a gang-loading operation. Preferably, for space-saving purposes, the terminal passages would consume substantially the entire upper face of the connector housing. When separate boardlock devices are used, not only must the housing be enlarged, but secondary operations must be employed for inserting the boardlock devices. There usually is insufficient space at the top of the housing for simultaneously inserting both the terminals and the boardlock devices. Of course, mounting pegs molded integrally with the housing takes up space on the circuit board which otherwise could be used for additional high density circuit traces.

This invention is directed to solving the above myriad of problems, particularly in high density miniaturized electrical connectors, by providing a boardlock system which is made functional from a side of the connector housing and, thereby, does not take up valuable space in the upper face of the housing which receives the terminals and also does not interfere with mass top loading of the terminals into the housing.

SUMMARY OF THE INVENTION

An object, therefore, of the invention is to provide a new and improved boardlock system of the character described.

In the exemplary embodiment of the invention, an electrical connector assembly is disclosed for mounting on a surface of a printed circuit board. The connector assembly includes a dielectric housing having an upper face with a plurality of terminal-receiving passages for top loading a plurality of terminals thereinto and a lower circuit board engaging face. The terminal-receiving passages consume substantially the entire area of the upper face. A boardlock system is provided for mounting the connector assembly on the printed circuit board.

The invention contemplates that the boardlock system include a boardlock-receiving cavity at one side of the housing with an open top at one side of the upper face. An access slot is provided in the side of the housing communicating with the cavity for the insertion thereinto of an appropriate tool from the side of the housing. A boardlock device is insertable into the open top of the cavity and includes a lower end for interengagement with the circuit board for holding the connector assembly on the board and an upper end located in the cavity, aligned with the access slot, for engagement by the tool from the side of the housing. Therefore, the boardlock device can be engaged by the tool simultaneously with gang loading the terminals into the housing without interfering with the top loading operation of the terminals.

As disclosed herein, the housing has a plurality of side walls bounding the upper face of the housing. An integral enlarged portion of the housing projects outwardly from one side wall and within which the boardlock-receiving cavity is disposed. The access slot intersects and passes through the boardlock-receiving cavity whereby the tool can pass completely through the cavity for solid engagement with the upper end of the boardlock device.

Still further, the boardlock device of the invention preferably is generally planar and is stamped and formed from sheet metal material. The boardlock-receiving cavity is defined by opposing side wall means spaced slightly wider than the thickness of the sheet metal boardlock device. The boardlock-receiving cavity further is defined by opposing end walls spanning the side wall means, and the boardlock device includes teeth projecting from at least one edge thereof for interengagement with one of the end walls of the cavity.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 1 is a perspective view of an electrical connector assembly incorporating the boardlock system of the invention;

FIG. 2 is a perspective view of one of the boardlock devices;

FIG. 3 is a fragmented elevational view of an appropriate tool, for actuating the boardlock device;

FIG. 4 is a fragmented elevational view of the tool, as looking toward the left in FIG. 3; and FIG. 5 is a top plan view showing the tool in engagement with the upper end of the boardlock device.

DETAILED DESCRIPTION OF THE PREFERRED EMBODIMENT

Referring to the drawings in greater detail, and first to FIG. 1, the boardlock system of the invention is incorporated in an electrical connector assembly, generally designated 10, adapted for mounting on a surface of a printed circuit board (not shown). The connector assembly includes a unitarily molded dielectric housing (such as of plastic material), generally designated 12, having an upper face 14 and a lower face 16. The upper face includes a plurality of terminal-receiving passages 18 for top loading a plurality of terminals thereinto in a gang or mass loading operation. The passages are through passages and the terminals will have tail portions for interconnection to circuit traces on the printed circuit board, in a known fashion, as by reflow soldering. As shown, the housing is generally rectangular in configuration and includes opposite side walls 20 and opposite end walls 22 which form the boundary of upper face 14 of the housing. It can be seen that passages 18 efficiently consume substantially the entire area of the upper face and, thereby, conserves valuable circuit board real estate, particularly in miniaturized integrated circuit applications.

Generally, the boardlock system of the invention is designed to be completely outside the boundary of upper face 14 so that housing 12 does not have to be unduly enlarged and, particularly, so that the boardlock devices can be made functional by an appropriate tool without interfering with simultaneous top loading of the terminals into passages 18 in the upper face of the housing.

More particularly, it can be seen in FIG. 1 that housing 12 is provided with an integrally molded, outwardly projecting enlarged portion 24 on one side wall 20. It should be understood that a similar enlarged portion (along with a respective boardlock device, described hereinafter) may be and, preferably, is located projecting outwardly from the opposite side wall but which is not visible in the drawing. Therefore, only one enlarged portion 24 and boardlock device will be described hereinafter.

The enlarged portion 24 at one or both sides of housing 12 includes a narrow cavity 26 extending vertically of the entire length of the enlarged portion, for the insertion thereinto of a boardlock device (described hereinafter) in the direction of arrow "A". An access slot 28 communicates with cavity 26 for insertion thereinto of a tool (described hereinafter) from the side of the housing so that the tool does not interfere with top loading of terminals into passages 18. Actually, it can be seen in FIG. 1 that access slot 28 intersects and passes through cavity 26 whereby the cavity actually is formed by cavity potions running the length of and along opposite sides of the access slot. Outwardly projecting reinforcing bosses 30 are molded integrally with enlarged portion 24 to provide a mass of plastic material bounding cavity portions 26. It can be seen that access slot 28 extends through the reinforcing bosses.

Referring to FIG. 2 in conjunction with Figure 1, a boardlock device, generally designated 32, is insertable into cavity 26 in the direction of arrow "A" (FIG. 1). As best seen in FIG. 2, the boardlock device is generally planar and includes a bifurcated lower end 34 for insertion into a hole in the printed circuit board. The bifurcated lower end is of a conventional configuration to provide a pair of yieldable legs having upwardly facing hook portions 36 which snap behind the lower surface of the printed circuit board after the lower end of the device is inserted into a hole in the board. The boardlock device 32 also includes an upper end 38 which is located in cavity 26, with a notch 40 formed in the upper end for receiving a tool, as described hereinafter. Notch 40 is aligned with access slot 28 as seen in FIG. 1. Lastly, a plurality of securing teeth 42 project outwardly from at least one edge of the boardlock device, such as at upper end 38 of the device as seen in FIG. 2.

The boardlock device 32 preferably is stamped and formed from sheet metal material in a simple fabricating process. Therefore, the boardlock device has a given thickness and a given width between its opposite edges. Preferably, the opposite side walls of cavity portions 26 are spaced slightly wider than the thickness of the sheet metal boardlock device to allow free insertion of the device thereinto, but the cavity portions should be sufficiently narrow to provide support for the boardlock device against buckling when engaged by an insertion tool. However, the end walls defined by cavity portions 26 should be spaced slightly less than the width of the boardlock device including teeth 42. Therefore, the teeth can establish a securing interference fit with the plastic material of the unitary housing and thereby securely hold the housing to the printed circuit board.

Referring to FIGS. 3 and 4, a tool, generally designated 46, includes a base portion 48 having a horizontally extending shaft 50 projecting from one side thereof. The shaft has a circumferential groove 52 defining a head portion 54 of the shaft. The shaft is oblong is configuration, as best seen in FIG. 3, and the width of the portion of the shaft within groove 52 is slightly narrower than the width of notch 40 in upper end 38 of boardlock device 32, so that the shaft can be inserted downwardly into the notch.

FIG. 5 shows boardlock device 32 positioned into cavity portions 26, with shaft 50 of tool 46 projecting into access slot 28. It can be seen that the portion of the shaft defined by groove 52 is positioned in notch 40 at the upper end of the boardlock device, and head portion 54 of the shaft is located on the inside of the boardlock device to provide additional support for the sheet metal device against buckling.

The advantages of the boardlock system of the invention can be understood by a brief review of the assembly operations involved with electrical connector assembly 10. Specifically, as stated above, appropriate terminals are top loaded into passages 18 in a gang or mass loading operation from the top of housing 12. With the terminal-receiving passages consuming substantially the entire upper face 14 of the housing, in order to conserve valuable board real estate, there is little room for a tool to drive boardlock device 32 downwardly in the direction of arrow "A" (FIG. 1) from the top of the housing without interfering with the top loading of the terminals. Consequently, with the boardlock system of the invention, tool 46 can be disposed at the side of the housing as shown in FIG. 5 and, thereby, not interfere with the top loading of the terminals. In fact, the boardlock device can be inserted simultaneously with the top loading of the terminals, if desired, and thereby avoid a secondary loading or board-insertion operation.

Finally, it should be understood that such terms as "upper", "lower", "top", "bottom" etc. as used herein and in the claims hereof is not to be construed as limiting. Those terms have been used to facilitate a clear and concise description of the invention with reference to the depictions in the drawings, it being understood that electrical connector assembly 10 is omnidirectional in use and function, as is well known in the integrated circuit art.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. In an electrical connector assembly for mounting on a surface of a printed circuit board, including a dielectric housing having an upper face with a plurality of terminal-receiving passages for top loading a plurality of terminals thereinto and a lower circuit board engaging face, and a boardlock system for mounting the connector assembly on the printed circuit board, wherein the improvement in said boardlock system comprises a boardlock-receiving cavity at one side of the housing with an open top at one side of the upper face and an access slot in the side of the housing communicating with the cavity for insertion thereinto of a tool from the side of the housing, and a boardlock device insertable into the open top of the cavity and including a lower end for interengagement with the circuit board for holding the connector assembly on the board and an upper end located in the cavity, aligned with the access slot, for engagement by said tool from the side of the housing.

2. In an electrical connector assembly as set forth in claim 1, wherein said housing has a plurality of side walls bounding the upper face of the housing, and including an enlarged portion of the housing projecting outwardly from one side wall and within which the boardlock-receiving cavity is disposed.

3. In an electrical connector assembly as set forth in claim 1, wherein said boardlock device includes a notch in its upper end for interengagement with the tool.

4. In an electrical connector assembly as set forth in claim 3, wherein said boardlock device is generally planar and is stamped and formed from sheet metal material.

5. In an electrical connector assembly as set forth in claim 4, wherein said boardlock-receiving cavity is defined by opposing side wall means spaced slightly wider than the thickness of the sheet metal boardlock device.

6. In an electrical connector assembly as set forth in claim 5, wherein said cavity is defined by opposing end walls between the side wall means, and the boardlock device includes teeth on at least one edge thereof for interengagement with one of the end walls of the cavity.

7. In an electrical connector assembly as set forth in claim 1, wherein said access slot intersects and passes through the boardlock-receiving cavity whereby the tool can pass completely through the cavity for solid engagement with the upper end of the boardlock device.

8. In an electrical connector assembly as set forth in claim 7, wherein said boardlock device includes a notch in its upper end for interengagement with the tool.

9. In an electrical connector assembly as set forth in claim 7, wherein said housing has a plurality of side walls bounding the upper face of the housing, and including an enlarged portion of the housing projecting outwardly from one side wall and within which the boardlock-receiving cavity is disposed.

10. In an electrical connector assembly as set forth in claim 9, wherein said boardlock device includes a notch in its upper end for interengagement with the tool.

* * * * *